(12) United States Patent
Zhao et al.

(10) Patent No.: US 8,274,417 B2
(45) Date of Patent: *Sep. 25, 2012

(54) COARSE DIGITAL-TO-ANALOG CONVERTER ARCHITECTURE FOR VOLTAGE INTERPOLATION DAC

(75) Inventors: Jianhua Zhao, Shanghai (CN); Shawn Wang, Shanghai (CN)

(73) Assignee: STMicroelectronics R&D (Shanghai) Co., Ltd., Shanghai (CN)

( * ) Notice: Subject to any disclaimer, the term of this patent is extended or adjusted under 35 U.S.C. 154(b) by 37 days.

This patent is subject to a terminal disclaimer.

(21) Appl. No.: 12/965,651

(22) Filed: Dec. 10, 2010

(65) Prior Publication Data

US 2012/0032828 A1    Feb. 9, 2012

(30) Foreign Application Priority Data

Aug. 4, 2010 (CN) .......................... 2010 1 0247802

(51) Int. Cl.
H03M 1/66    (2006.01)
(52) U.S. Cl. ........................................ 341/145; 341/155
(58) Field of Classification Search ........... 341/140–160
See application file for complete search history.

(56) References Cited

U.S. PATENT DOCUMENTS

| | | | | |
|---|---|---|---|---|
| 5,731,774 A * | 3/1998 | Fujii et al. | ...................... | 341/144 |
| 5,977,898 A * | 11/1999 | Ling et al. | ...................... | 341/144 |
| 6,163,289 A * | 12/2000 | Ginetti | .......................... | 341/145 |
| 6,642,877 B2 * | 11/2003 | Leung | ............................ | 341/144 |
| 7,079,062 B2 * | 7/2006 | Panov et al. | .................. | 341/144 |
| 7,173,597 B2 * | 2/2007 | Kato | ............................... | 345/99 |
| 7,283,082 B1 * | 10/2007 | Kuyel | ........................... | 341/155 |
| 7,304,596 B2 * | 12/2007 | Lin et al. | ....................... | 341/145 |
| 2003/0128071 A1 | 7/2003 | Nguyen et al. | | |
| 2012/0032828 A1 | 2/2012 | Zhao et al. | | |

* cited by examiner

*Primary Examiner* — Lam T Mai
(74) *Attorney, Agent, or Firm* — Gardere Wynne Sewell LLP

(57) ABSTRACT

For coarse resistor string DACs, a resistor string is placed in an array of columns and rows, each resistor tap is connected to a switch network, and a decoder is used to select switches to be closed such that sub-DAC voltage comes from the resistor taps connected to the selected switches. The voltages from each row are fed into multiplexers, wherein the multiplexers produce output voltages. DAC circuit designs extend the resolution of the output voltages by feeding them into a voltage interpolation amplifier. A method and apparatus are disclosed for implementing Gray code to design coarse DAC architecture for voltage interpolation such that the number of switches required by the circuit is significantly reduced, thereby decreasing required surface area, and improving glitch performance without increasing design complexity.

29 Claims, 6 Drawing Sheets

COARSE DIGITAL-TO-ANALOG CONVERTER ARCHITECTURE FOR VOLTAGE INTERPOLATION DAC

CROSS-REFERENCE TO RELATED APPLICATIONS

Pursuant to 35 U.S.C. §119 (a)-(d), this application claims priority to Chinese Patent Application No. 201010247802.4, entitled "Coarse Digital-to-Analog Converter Architecture for Voltage Interpolation DAC," filed Aug. 4, 2010.

BACKGROUND

1. Technical Field

The present invention relates generally to Digital-to-Analog circuitry and, more specifically, to a method and apparatus for a coarse Digital-to-Analog Converter architecture for voltage interpolation.

2. Introduction

A coarse Digital-to-Analog Converter (DAC) architecture is commonly used in mixed-mode systems requiring monotonicity, wherein the DAC acts as an interface to convert a digital code to an analog signal. For high resolution resistor string DACs, the resistor string is typically placed in several rows whereby the resistors of one row align with resistors of another row to form columns. In this design, each resistor is connected to a switch network through a resistor tap, and a binary-to-unary decoder is used to select switches to be closed such that the sub-DAC voltage comes from the resistor taps connected to the selected switches. The output voltage from each row is then fed into a multiplexer, wherein the multiplexer produces the coarse DAC output voltages. Conventional coarse DAC designs attempt to extend the resolution of differential resistor string DACs by feeding the multiplexer output voltages into a voltage interpolation amplifier.

One such resistor string DAC design includes an M-bit coarse DAC combined with an N-bit interpolation amplifier to achieve M+N bit total resolution, wherein the coarse DAC is used to generate two DAC voltages with a voltage difference of $2^N * V_{LSB}$, the voltage difference across one resistor in a string of resistors in the coarse DAC circuit. This design includes a resistor string comprising $2^M$ resistors, with two sets of switches connected to each resistor tap. Accordingly, the number of switches is equal to twice the number of resistors. For input data K, the Kth tap is connected to low output voltage VOL and the K+1th tap is connected to high output voltage VOH. Due to the large number of switches, this design requires a significant amount of circuit real estate and generates a significant glitch when changing data.

SUMMARY

The present disclosure provides a method and apparatus for implementing Gray code in a differential resistor string DAC architecture for a high resolution coarse DAC with voltage interpolation such that significantly fewer switches are connected to the resistor taps in the coarse DAC circuit. By reducing the number of switches connected to the resistor taps, the circuit real estate required is significantly reduced and glitch performance is improved without significantly increasing the complexity of the circuit.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures, in which like reference numbers indicate similar parts, and in which.

DETAILED DESCRIPTION OF THE DRAWINGS

An embodiment of the present disclosure provides a method and apparatus for implementing Gray code in a differential resistor string DAC architecture for a high resolution coarse DAC with voltage interpolation such that significantly fewer switches are connected to the resistor taps in the coarse DAC circuit. By reducing the number of switches connected to resistor taps, the circuit real estate required is significantly reduced and glitch performance is improved without significantly increasing the complexity of the circuit.

Figure 1:
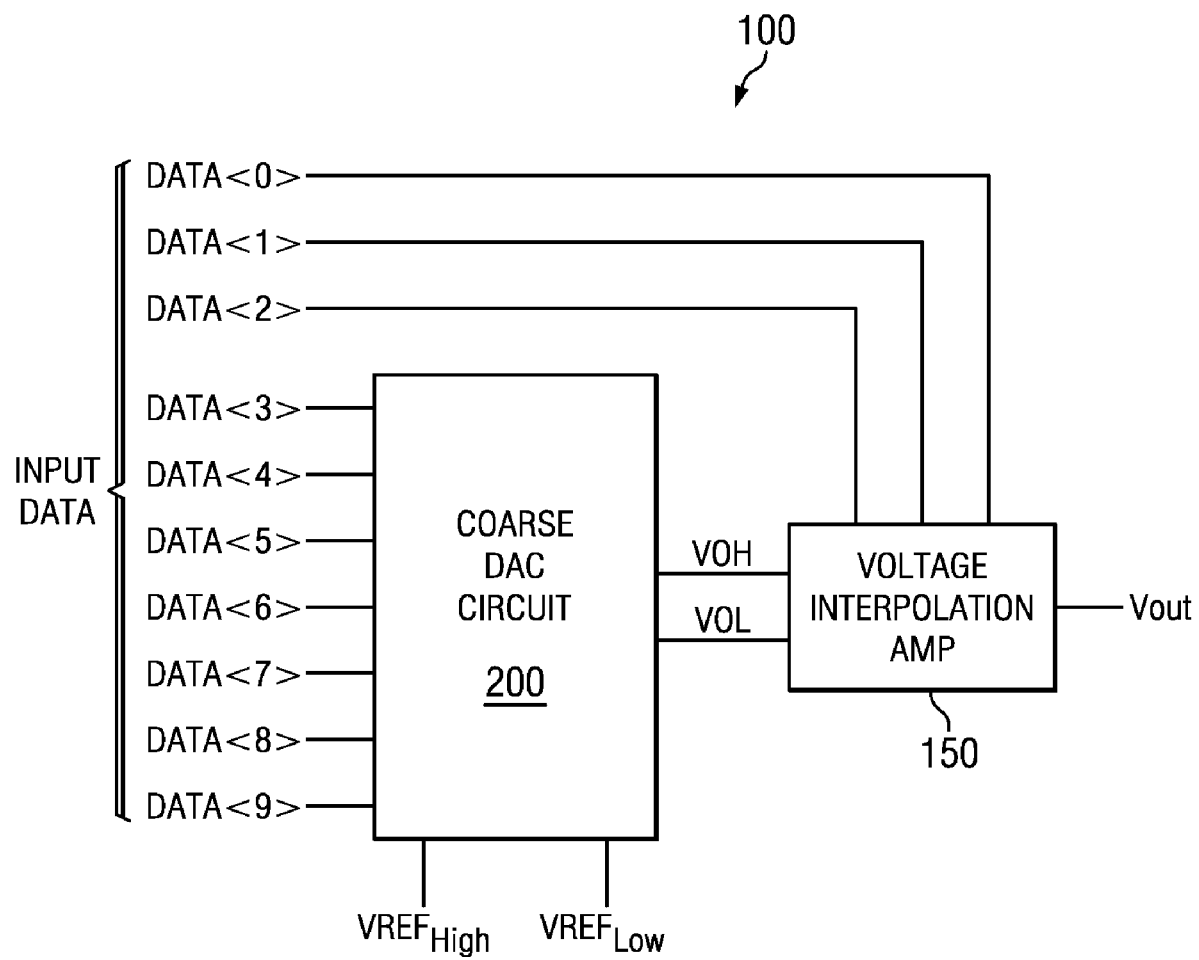
FIG. 1 is a circuit diagram for an example 10-bit DAC circuit with a 7-bit coarse DAC and 3-bit voltage interpolation amplifier.

Reference is made to FIG. 1, which illustrates an M+N bit DAC circuit 100 comprising an M-bit coarse DAC circuit 200 and an N-bit voltage interpolation amplifier 150, where M is the number of input bits received at the coarse DAC circuit 200 and N is the number of input bits received at the voltage interpolation amplifier 150. In accordance with an example embodiment disclosed in the present application, the M+N bit DAC circuit 100 is a 10-bit DAC circuit 100. Accordingly, the DAC circuit includes a 10-bit data input, DATA<9:0>, wherein the three least significant bits (LSBs), DATA<2:0>, are provided as input to the N-bit voltage interpolation amplifier 150, and the remaining seven input data bits DATA<9:3> are input to the M-bit differential resistor string coarse DAC circuit 200. It should be understood that the scope of the present disclosure is not limited to the disclosed 10-bit embodiment of the DAC circuit 100, and that the DAC circuit 100 may be designed to accommodate a greater or smaller input data size. Additionally, the differential resistor string coarse DAC circuit 200 is not limited to a seven-bit embodiment, and the voltage interpolation amplifier 150 is not limited to the three-bit embodiment disclosed herein. These design variables may differ based on the characteristics desired by the circuit designer without departing from the scope of the present disclosure as set forth and defined in the claims included herewith.

The coarse DAC circuit 200 includes a high reference voltage node $VREF_{HIGH}$ and a low reference voltage node $VREF_{LOW}$. The coarse DAC circuit 200 receives a differential input voltage, wherein a high reference voltage is received at the $VREF_{HIGH}$ node and a low reference voltage is received at the $VREF_{LOW}$ node. Additionally, the circuit 200 has a common mode voltage, $V_{COM}$, wherein the common mode voltage $V_{COM}$ is equal to half the difference of the $VREF_{HIGH}$ and $VREF_{Low}$ voltages as represented by the equation below:

$$V_{com} = \frac{VREFHIGH - VREFLOW}{2}$$

The differential coarse DAC circuit 200 produces high and low output voltages, VOH and VOL, wherein the difference between the two voltages is $2^N * V_{LSB}$, or the voltage difference across one resistor in a string of resistors in the coarse DAC circuit 200. In accordance with the example embodiment disclosed in the present application in which N=3, if the DAC has 128 resistors, and a reference voltage of 1.024V is divided evenly across the string of resistors, then the difference across a resistor located between the two voltages, and thus, the difference between the two voltages VOH and VOL, is approximately 8 mV (1.024V divided across 128 resistors). The value of the voltage difference across one resistor in the string of resistors may also be represented as $2^N * V_{LSB}$, wherein $V_{LSB}$=1 mV. Accordingly, $2^3 * 1$ mV=8 mV.

The two output voltages, VOH and VOL, are provided as input to the three-bit voltage interpolation amplifier 150, wherein the voltage interpolation amplifier 150 may be of any architecture. In accordance with the present disclosure, the voltage interpolation amplifier 150 receives the three LSBs of the input data signal DATA<2:0> and the high and low output voltages, VOH and VOL, of the coarse DAC circuit 200, and produces a final output voltage, $V_{OUT}$, of the DAC circuit 100.

Several components of the present disclosure may comprise multiple elements, and may be represented as a group of said elements in a particular order. For example, the input data of FIG. 1 is comprised of 10 bits. Accordingly, the bits may be represented as "DATA<0:9>" wherein the numbers "0" and "9" indicate DATA bit 0, or DATA<0>, through DATA bit 9, or DATA<9>, (and all bits in between) in ascending order. Additionally, if the bits are represented as "DATA<9:0>" the numbers indicate DATA<9> through DATA<0> (and all bits in between) in descending order. This representation may be applied to any group of elements within the present disclosure.

Figure 2:
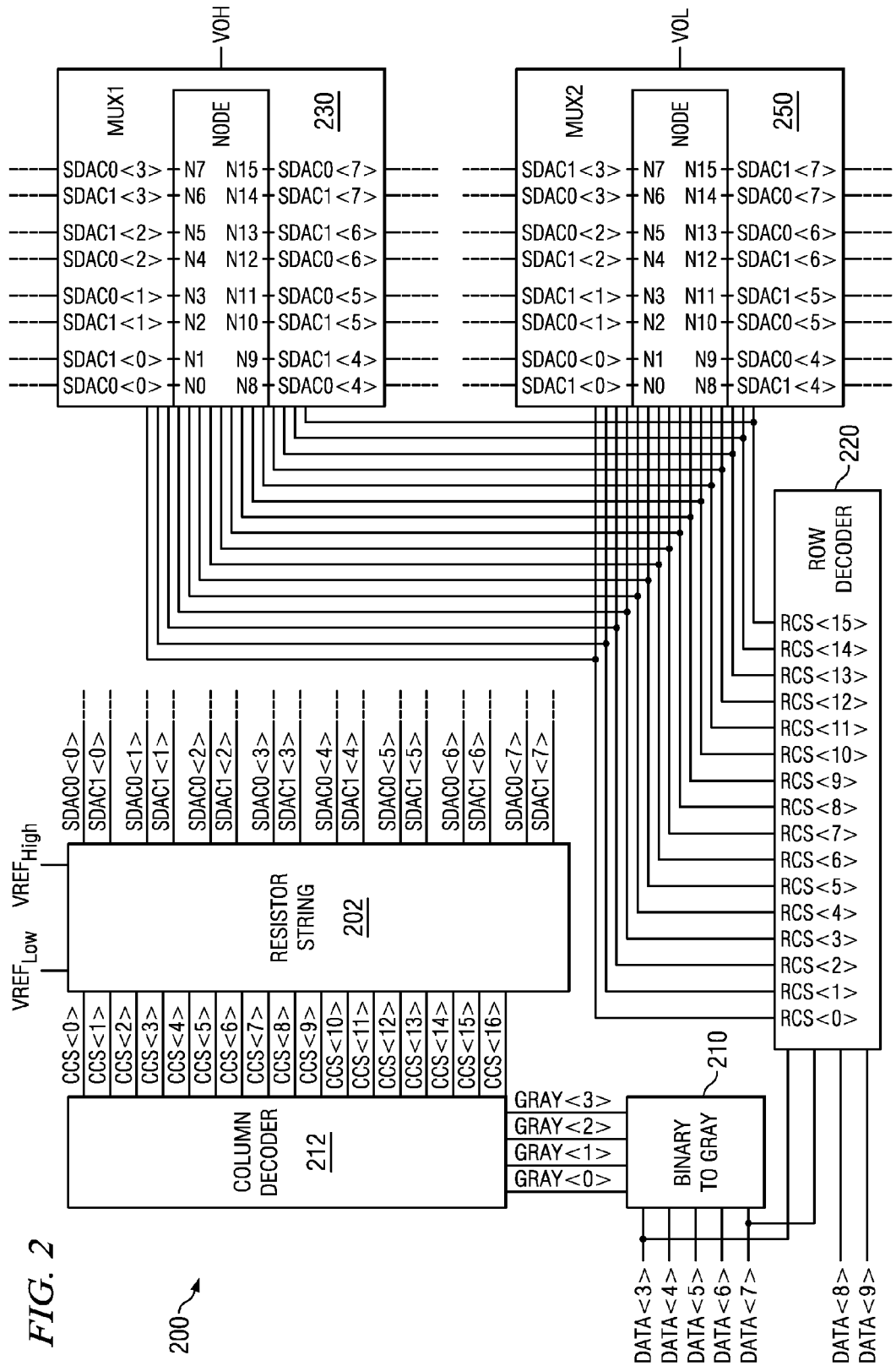
FIG. 2 is a circuit diagram of the 7-bit coarse DAC of FIG. 1.

Reference is now made to FIG. 2, which further illustrates the example 7-bit resistor string coarse DAC circuit 200 of FIG. 1, wherein, as previously stated, input data bits DATA<9:3> are input to the coarse DAC circuit 200. Five intermediate bits, DATA<7:3>, of the input data are connected to a binary-to-Gray code converter 210, and are thereby converted into four-bit Gray coded data, GRAY<3:0>. The Gray coded data, GRAY<3:0>, is then applied to a column decoder 212, wherein the column decoder 212 may be any decoder circuit. The Gray coded data, GRAY<3:0>, is decoded by the column decoder 212 to produce a set of 17 unary column control signal bits CCS<0:16> (otherwise referred to as a column control signal), wherein the set of column control signal bits CCS<0:16> is the output of the column decoder 212. Each of the 17 column control signal bits CCS<0:16> are connected to a column of switches located in a string of series-connected resistors 202. It should be appreciated that the term "connect" or "connected" as used herein does not require that there be a direct connection between any two elements.

Figure 3A:
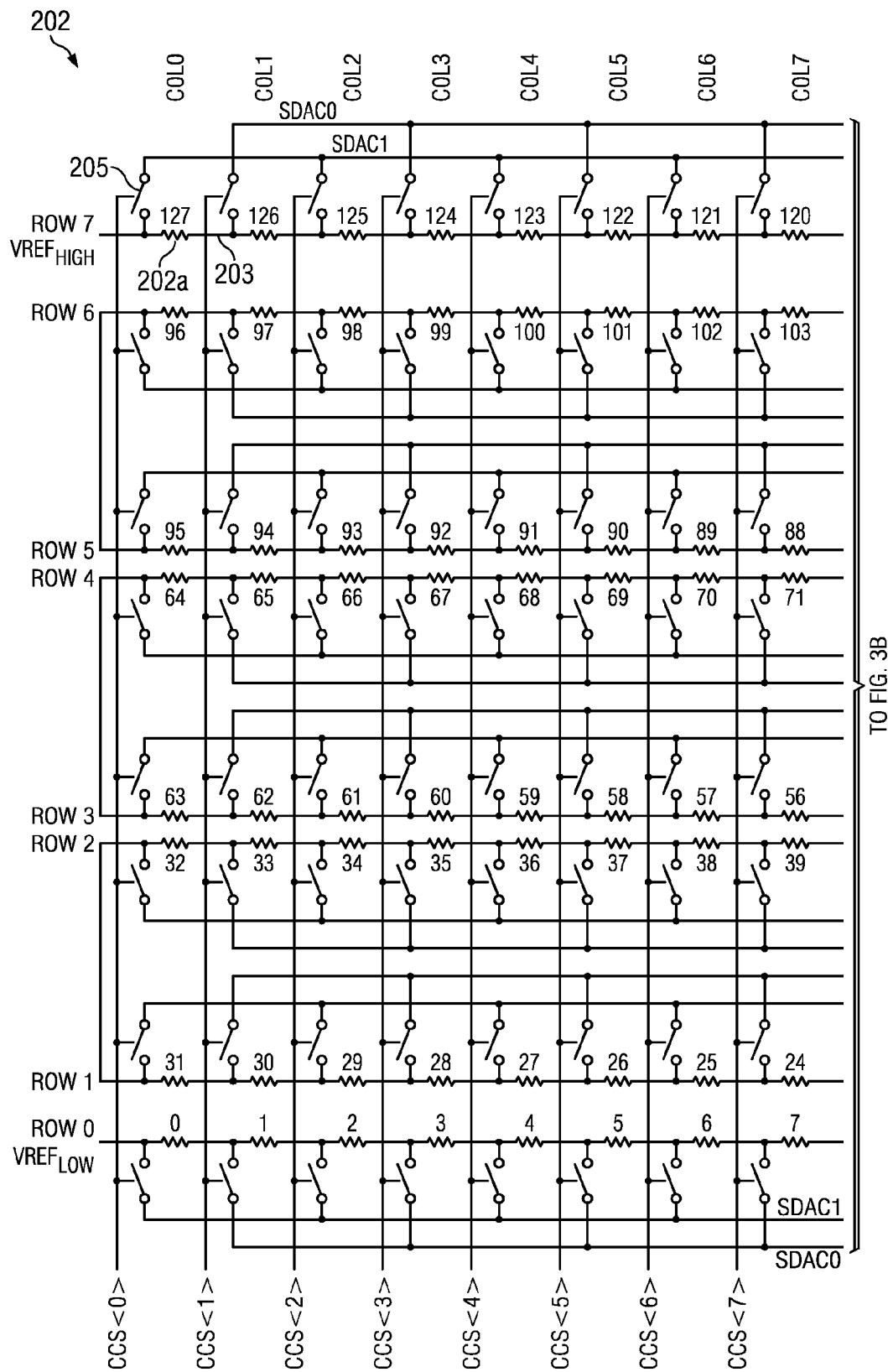
FIGS. 3A and 3B illustrate a circuit diagram of the resistor string of FIG. 2.
Figure 3B:
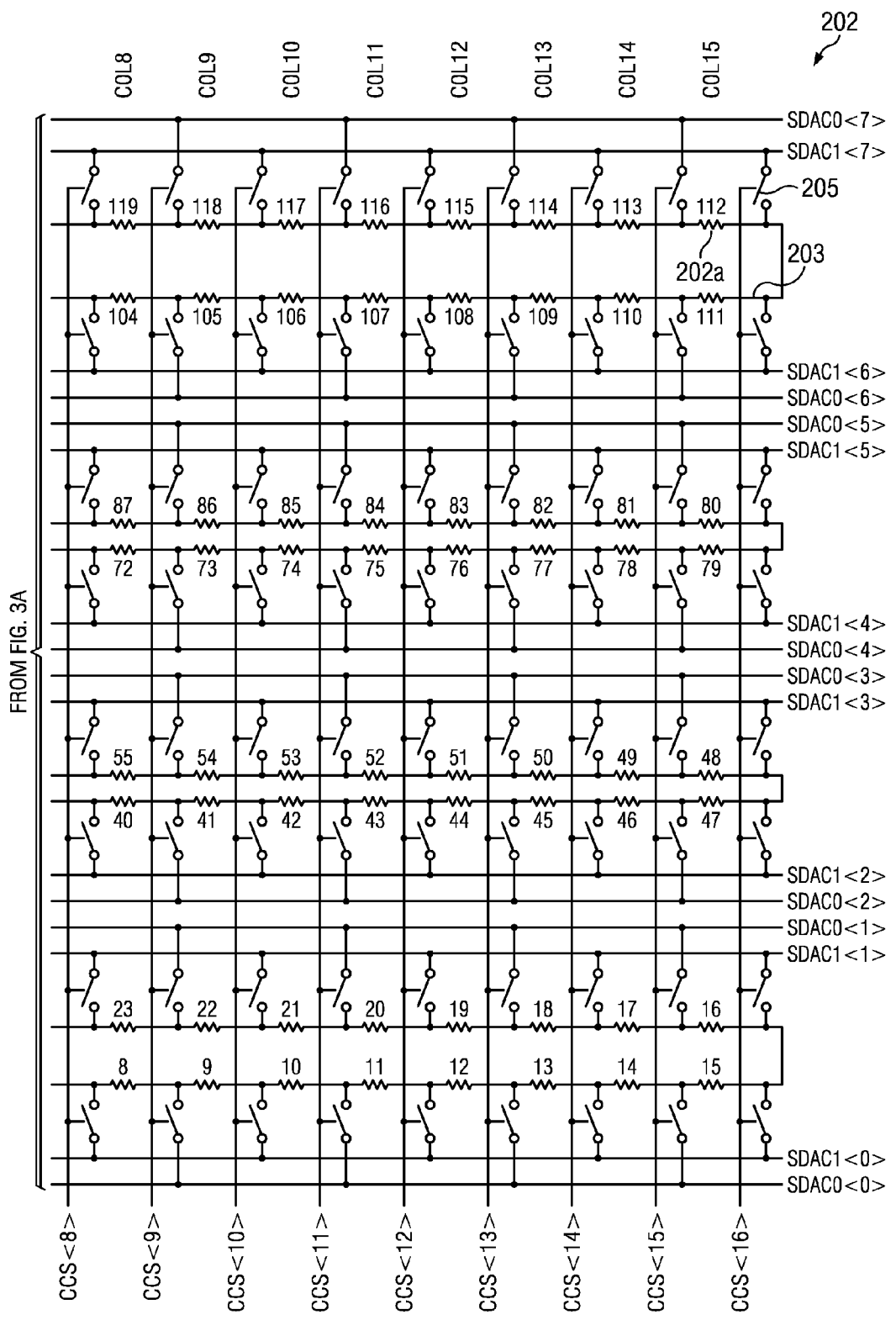

FIGS. 3A and 3B provide a detailed illustration of the string of series-connected resistors 202, showing how all the components of the resistor string 202 are connected. The string of resistors 202 includes 17 columns of switches 205, wherein each switch 205 is operable to be connected to a resistor tap node 203. The string of resistors 202 is connected to the reference voltage nodes $VREF_{HIGH}$ and $VREF_{LOW}$ of the coarse DAC circuit 200, and is laid out in a zigzag pattern to form an array of eight rows and sixteen columns of resistors 202 such that the current in the odd rows flows in one direction, and the current in the even rows flows in the opposite direction. The eight rows of resistors 202 in the array are numbered from ROW0 to ROW7 and include even rows ROW0, ROW2, ROW4, and ROW6 and odd rows ROW1, ROW3, ROW5, and ROW7, wherein each row contains sixteen individual resistors 202a and seventeen switches 205. The sixteen columns of resistors 202 in the array are numbered from COL0 to COL15 and include even columns COL0, COL2, COL4, COL6, COL8, COL10, COL12, and COL14 and odd columns COL1, COL3, COL5, COL7, COL9, COL11, COL13, and COL15, wherein each column contains eight individual resistors 202a. The resistance values of the resistors 202 are substantially the same, and a difference between the reference voltages at the nodes $VREF_{HIGH}$ and $VREF_{Low}$ is divided evenly across each resistor 202a. Although the resistors 202 typically have substantially equal resistance values, it may be advantageous to implement resistors 202 having varying resistance values across the string of resistors 202.

In accordance with the present disclosure, when reference is made to a group of resistors, reference number "202" is used. When reference is made to an arbitrary individual resistor, reference number "202a" is used. Additionally, each individual resistor 202a located in the array is individually numbered (from 0-127 as shown) such that when reference is made to a specific resistor, the corresponding resistor number is used. For example, according to FIGS. 3A and 3B, "resistor number 0" or "resistor 0" refers to the first resistor 202a located in the first column (COL0), along the first row (ROW0) of resistors 202 between the low reference voltage node $VREF_{Low}$ and the second resistor 202a, resistor 1.

Each individual resistor 202a in the string of resistors 202 is connected to an adjacent individual resistor 202a at a resistor tap node 203, wherein "resistor tap node" 203 may be disclosed herein as "resistor tap node," "resistor tap," or "tap." Also located at each resistor tap node 203 is a switch 205, wherein the switch 205 may be any transistor, such as, for example, a pass FET. As illustrated in FIGS. 3A and 3B, each switch 205 is affixed to either a first sub-DAC voltage line, SDAC0, or a second sub-DAC voltage line, SDAC1. In addition, the switches 205 are arranged in columns, wherein each column of switches 205 is operable to be controlled by a column control signal bit CCS<0:16> to connect to a resistor tap node 203 of a resistor 202a in the string of resistors 202. When a column control signal bit CCS<0:16> is "0" (as illustrated in Table 1 below) the switches 205 in the column corresponding to the column control signal bit CCS<0:16> are open and, thus, are not connected to their respective resistor taps 203. When a column control signal bit CCS<0:16> is set to "1" the switches 205 in the column corresponding to the set column control signal bit CCS<0:16> are closed, and the voltage across the resistor(s) 202a located between the low reference voltage node $VREF_{LOW}$ and each closed switch 205 is applied to the respective sub-DAC voltage line, SDAC0 or SDAC1, of each closed switch 205. This voltage is called the "sub-DAC voltage," and may be referred to herein as the "resistor string voltage." For example, the switch 205 located at the tap node 203 between resistor 32 and resistor 33 is controlled by column control signal bit CCS<1>. When CCS<1> is set to "1" the switch 205 (and all other switches 205 in the column controlled by column control signal bit CCS<1>) is closed such that the switch 205 connects the tap node 203 to the SDAC0 voltage line of ROW2, and the voltage across resistors 0-32 is applied to the first sub-DAC voltage line, SDAC0, of ROW2.

The sub-DAC voltage at each first sub-DAC voltage line SDAC0 and second sub-DAC voltage line SDAC1 is labeled according to the corresponding row of each first sub-DAC voltage line SDAC0 and second sub-DAC voltage line SDAC1. For example, the sub-DAC voltage located along the first sub-DAC voltage line, SDAC0, of ROW2 is labeled as SDAC0<2>. Additionally, the sub-DAC voltage located along the second sub-DAC voltage line, SDAC1, of ROW2 is labeled as SDAC1<2>. Accordingly, there are eight first sub-DAC voltage lines SDAC0 having respective sub-DAC voltages SDAC0<0:7>, and eight second sub-DAC voltage lines SDAC1 having respective sub-DAC voltages SDAC1<0:7>, wherein the sub-DAC voltages SDAC0<0:7> and SDAC1<0:7> are the output of the string of series-connected resistors 202.

In accordance with FIGS. 3A and 3B, and the disclosure above, the column control signal comprises 17 bits (CCS<0:16>); therefore, the array of series-connected resistors 202 comprises seventeen columns of switches 205, sixteen columns (COL<0:15>) of resistors 202, and eight rows (ROW<0:7>), each row comprising seventeen switches 205 and sixteen resistors 202. Accordingly, the resistor tap nodes 203 disposed between the even and odd rows of the resistor string 202 (where each even and odd row are connected) have two switches 205 connected thereto, and the resistor tap nodes 203 disposed other than between even and odd rows have one switch 205 connected thereto. As such, switches 205 located in the column controlled by CCS<16> connect at common tap nodes 203 between row pairs ROW0 and ROW1, ROW2 and ROW3, ROW4 and ROW5, and ROW6 and ROW7 such that, for each pair, the common tap node 203 (located between a resistor 202a in the odd row and a resistor 202a in the even row) may be connected to the SDAC1 voltage lines of both the even and odd rows. For example, the switches 205 disposed between resistor 15 (of even row ROW0) and resistor 16 (of odd row ROW1) are controlled by CCS<16> and, when activated, are operable to connect the resistor tap 203 located between resistor 15 and resistor 16 to sub-DAC voltage lines SDAC1 of ROW0 and SDAC1 of ROW1. In accordance with this example, SDAC1<0> and SDAC1<1> are both equal to the voltage across resistors 0-15.

Additionally, switches 205 located in the column controlled by CCS<0> connect at common tap nodes 203 between row pairs ROW1 and ROW2, ROW3 and ROW4, and ROW5 and ROW6 such that, for each pair, the common tap node 203 (located between a resistor 202a in the even row and a resistor in the odd row) may be connected to the SDAC1 voltage lines of both the even and odd rows. For example, the switches 205 disposed between resistor 31 (of odd row ROW1) and resistor 32 (of even row ROW2) are controlled by CCS<0> and, when activated, are operable to connect the resistor tap 203 located between resistor 31 and resistor 32 to sub-DAC voltage lines SDAC1 of ROW1 and SDAC1 of ROW2. In accordance with this example, SDAC1<1> and SDAC1<2> are both equal to the voltage across resistors 0-31.

The switches 205 located in the columns controlled by column control signal bits CCS<1:15> are connected to the resistor taps 203 of the resistors 202 located in columns COL<1:15>. As mentioned above, each of these switches 205 are connected to one resistor tap 203, and each resistor tap 203 has one switch 205 connected thereto. As such, the switches 205 located in columns controlled by column control signal bits CCS<1, 3, 5, 7, 9, 11, 13, and 15> are operable to connect their respective taps 203 to the SDAC0 voltage lines of each row ROW<0:7>. Additionally, the switches 205 located in columns controlled by column control signal bits CCS<2, 4, 6, 8, 10, 12, and 14> are operable to connect their respective taps 203 to the SDAC1 voltage lines of each row ROW<0:7>.

Two adjacent column control signal bits CCS<0:16> are active at a time (in response to the Gray coded data GRAY<3:0>), and thus, the set of column control signal bits CCS<0:16> is operable to select, or activate, two adjacent columns of switches 205 connected to the respective resistor taps 203 of the resistors 202 corresponding to the two selected columns of switches 205. Accordingly, the set of column control signal bits CCS<0:16> determines which two of the seventeen switches 205 in each row of resistors 202 are closed such that the first sub-DAC voltage SDAC0 and second sub-DAC voltage SDAC1 in each row come from the respective resistor taps 203 connected to the switches 205 in the two adjacent columns of switches 205 selected by the set of column control signal bits CCS<0:16>. Because the two columns of switches 205 are adjacent, the difference between the sub-DAC voltages SDAC0 and SDAC1 of any row is equal to the voltage across the resistor 202a located between the activated switches 205 for that row. For example, if the columns of switches 205 corresponding to CCS<2:3> are activated, then the difference between the SDAC1 and SDAC0 voltages for ROW3 is equal to the voltage across resistor 61. This voltage difference may also be defined herein as $2^N * V_{LSB}$.

Table 1 provides a truth table illustrating the input data bits DATA<7:3>, the corresponding 4-bit Gray code GRAY<3:0>, and the decoded column control signal bits CCS<0:16>. Because the Gray code is reflective, the same Gray code value may represent more than one input data value, and accordingly, the corresponding set of column control signal bits CCS<0:16> may be used for more than one input value. For example, as illustrated in FIGS. 3A and 3B, and Table 1, resistor 3 and resistor 28 are in ROW0 and ROW1, respectively, of COL3, and are connected at their resistor taps 203 to the switches 205 controlled by column control signal bit CCS<3>. However, resistors 3 and 28 have different input data values 00010 and 11101, respectively. Nevertheless, because of the reflective property of the Gray code, they have the same Gray code value, 0011, and consequently, the same column control signal. The switches 205 connected to the resistor taps 203 of the resistors 202 located in COL3 are activated by the single column control signal bit CCS<3>. Accordingly, switches 205 located along a column of resistors 202 respond to a single column control signal bit.

TABLE 1

| DATA<7:3> | GRAY<3:0> | CCS<0:16> | | | | | | | | | | | | | | | | |
|---|---|---|---|---|---|---|---|---|---|---|---|---|---|---|---|---|---|---|
| 00000 | 0000 | 1 | 1 | 0 | 0 | 0 | 0 | 0 | 0 | 0 | 0 | 0 | 0 | 0 | 0 | 0 | 0 | 0 |
| 00001 | 0001 | 0 | 1 | 1 | 0 | 0 | 0 | 0 | 0 | 0 | 0 | 0 | 0 | 0 | 0 | 0 | 0 | 0 |
| 00010 | 0011 | 0 | 0 | 1 | 1 | 0 | 0 | 0 | 0 | 0 | 0 | 0 | 0 | 0 | 0 | 0 | 0 | 0 |
| 00011 | 0010 | 0 | 0 | 0 | 1 | 1 | 0 | 0 | 0 | 0 | 0 | 0 | 0 | 0 | 0 | 0 | 0 | 0 |
| 00100 | 0110 | 0 | 0 | 0 | 0 | 1 | 1 | 0 | 0 | 0 | 0 | 0 | 0 | 0 | 0 | 0 | 0 | 0 |
| 00101 | 0111 | 0 | 0 | 0 | 0 | 0 | 1 | 1 | 0 | 0 | 0 | 0 | 0 | 0 | 0 | 0 | 0 | 0 |

TABLE 1-continued

| DATA<7:3> | GRAY<3:0> | CCS<0:16> | | | | | | | | | | | | | | | | |
|---|---|---|---|---|---|---|---|---|---|---|---|---|---|---|---|---|---|---|
| 00110 | 0101 | 0 | 0 | 0 | 0 | 0 | 0 | 1 | 1 | 0 | 0 | 0 | 0 | 0 | 0 | 0 | 0 | 0 |
| 00111 | 0100 | 0 | 0 | 0 | 0 | 0 | 0 | 0 | 1 | 1 | 0 | 0 | 0 | 0 | 0 | 0 | 0 | 0 |
| 01000 | 1100 | 0 | 0 | 0 | 0 | 0 | 0 | 0 | 0 | 1 | 1 | 0 | 0 | 0 | 0 | 0 | 0 | 0 |
| 01001 | 1101 | 0 | 0 | 0 | 0 | 0 | 0 | 0 | 0 | 0 | 1 | 1 | 0 | 0 | 0 | 0 | 0 | 0 |
| 01010 | 1111 | 0 | 0 | 0 | 0 | 0 | 0 | 0 | 0 | 0 | 0 | 1 | 1 | 0 | 0 | 0 | 0 | 0 |
| 01011 | 1110 | 0 | 0 | 0 | 0 | 0 | 0 | 0 | 0 | 0 | 0 | 0 | 1 | 1 | 0 | 0 | 0 | 0 |
| 01100 | 1010 | 0 | 0 | 0 | 0 | 0 | 0 | 0 | 0 | 0 | 0 | 0 | 0 | 1 | 1 | 0 | 0 | 0 |
| 01101 | 1011 | 0 | 0 | 0 | 0 | 0 | 0 | 0 | 0 | 0 | 0 | 0 | 0 | 0 | 1 | 1 | 0 | 0 |
| 01110 | 1001 | 0 | 0 | 0 | 0 | 0 | 0 | 0 | 0 | 0 | 0 | 0 | 0 | 0 | 0 | 1 | 1 | 0 |
| 01111 | 1000 | 0 | 0 | 0 | 0 | 0 | 0 | 0 | 0 | 0 | 0 | 0 | 0 | 0 | 0 | 0 | 1 | 1 |
| 10000 | 1000 | 0 | 0 | 0 | 0 | 0 | 0 | 0 | 0 | 0 | 0 | 0 | 0 | 0 | 0 | 0 | 1 | 1 |
| 10001 | 1001 | 0 | 0 | 0 | 0 | 0 | 0 | 0 | 0 | 0 | 0 | 0 | 0 | 0 | 0 | 1 | 1 | 0 |
| 10010 | 1011 | 0 | 0 | 0 | 0 | 0 | 0 | 0 | 0 | 0 | 0 | 0 | 0 | 0 | 1 | 1 | 0 | 0 |
| 10011 | 1010 | 0 | 0 | 0 | 0 | 0 | 0 | 0 | 0 | 0 | 0 | 0 | 0 | 1 | 1 | 0 | 0 | 0 |
| 10100 | 1110 | 0 | 0 | 0 | 0 | 0 | 0 | 0 | 0 | 0 | 0 | 0 | 1 | 1 | 0 | 0 | 0 | 0 |
| 10101 | 1111 | 0 | 0 | 0 | 0 | 0 | 0 | 0 | 0 | 0 | 0 | 1 | 1 | 0 | 0 | 0 | 0 | 0 |
| 10110 | 1101 | 0 | 0 | 0 | 0 | 0 | 0 | 0 | 0 | 0 | 1 | 1 | 0 | 0 | 0 | 0 | 0 | 0 |
| 10111 | 1100 | 0 | 0 | 0 | 0 | 0 | 0 | 0 | 0 | 1 | 1 | 0 | 0 | 0 | 0 | 0 | 0 | 0 |
| 11000 | 0100 | 0 | 0 | 0 | 0 | 0 | 0 | 0 | 1 | 1 | 0 | 0 | 0 | 0 | 0 | 0 | 0 | 0 |
| 11001 | 0101 | 0 | 0 | 0 | 0 | 0 | 0 | 1 | 1 | 0 | 0 | 0 | 0 | 0 | 0 | 0 | 0 | 0 |
| 11010 | 0111 | 0 | 0 | 0 | 0 | 0 | 1 | 1 | 0 | 0 | 0 | 0 | 0 | 0 | 0 | 0 | 0 | 0 |
| 11011 | 0110 | 0 | 0 | 0 | 0 | 1 | 1 | 0 | 0 | 0 | 0 | 0 | 0 | 0 | 0 | 0 | 0 | 0 |
| 11100 | 0010 | 0 | 0 | 0 | 1 | 1 | 0 | 0 | 0 | 0 | 0 | 0 | 0 | 0 | 0 | 0 | 0 | 0 |
| 11101 | 0011 | 0 | 0 | 1 | 1 | 0 | 0 | 0 | 0 | 0 | 0 | 0 | 0 | 0 | 0 | 0 | 0 | 0 |
| 11110 | 0001 | 0 | 1 | 1 | 0 | 0 | 0 | 0 | 0 | 0 | 0 | 0 | 0 | 0 | 0 | 0 | 0 | 0 |
| 11111 | 0000 | 1 | 1 | 0 | 0 | 0 | 0 | 0 | 0 | 0 | 0 | 0 | 0 | 0 | 0 | 0 | 0 | 0 |

According to Table 1, and as discussed above, each set of column control signal bits CCS<0:16> has two activated bits, wherein the two activated bits are adjacent. Accordingly, two adjacent columns of switches 205 are activated such that, for each row ROW<0:7>, the sub-DAC voltages SDAC0 and SDAC1 come from two adjacent resistor taps 203, thus the difference in the SDAC0 voltage and the SDAC1 voltage is the difference across one resistor 202a in the row. Although the circuit dictates that the column control signal bits for CCS<1> through CCS<15> be set to "1" for two consecutive Gray code values, the decoder complexity is not increased because Gray code increments and decrements by changing only one bit for each incrementation or decrementation. Therefore, for any two sequential input data signals, the corresponding Gray code GRAY<3:0> changes by one bit and the column control signal shifts in one direction by one bit without requiring substantial additional circuitry. According to Table 1, the value of column control signal bits CCS<1:15> is determined by three bits of the Gray code data GRAY<3:0>, and the value of column control signal bits CCS<0> and CCS<16> are determined by four bits of the Gray code data GRAY<3:0>. Accordingly, the decoder can be built to use 3-input AND gate circuits for column control signal bits CCS<1:15> and 4-input AND gate circuits for column control signal bits CCS<0> and CCS<16>.

In accordance with the present embodiment, Table 2 illustrates the input data bits DATA<7:3>, the corresponding 4-bit Gray code GRAY<3:0>, and the number of resistors 202a across which the sub-DAC voltages SDAC0 and SDAC1 are received. For each input data signal, DATA<7:3>, one resistor tap 203 per row is connected to a first sub-DAC voltage line SDAC0 and one resistor tap 203 per row is connected to a second sub-DAC voltage line SDAC1. Additionally, because the sub-DAC voltages SDAC0 and SDAC1 come from adjacent resistor taps 203, the voltages SDAC1<0:7> at second sub-DAC voltage lines SDAC1 may be separated by one resistor 202a from the first sub-DAC voltages SDAC0<0:7> at first sub-DAC voltage lines SDAC0, depending on the state of the input data bits DATA<7:3>, as shown below in Table 2. For example, for input data signal 00001, the corresponding Gray code is 0001, and the sub-DAC voltage SDAC1<0> is the voltage across two resistors (resistor 0 and resistor 1), while the sub-DAC voltage SDAC0<0> is the voltage across one resistor (resistor 0) as shown in FIGS. 3A and 3B.

TABLE 2

| DATA<7:3> | GRAY<3:0> | SDAC1<0> | SDAC0<0> | SDAC1<1> | SDAC0<1> | ... |
|---|---|---|---|---|---|---|
| 00000 | 0000 | 0 | 1/128 | 32/128 | 31/128 | ... |
| 00001 | 0001 | 2/128 | 1/128 | 30/128 | 31/128 | ... |
| 00010 | 0011 | 2/128 | 3/128 | 30/128 | 29/128 | ... |
| 00011 | 0010 | 4/128 | 3/128 | 28/128 | 29/128 | ... |
| 00100 | 0110 | 4/128 | 5/128 | 28/128 | 27/128 | ... |
| 00101 | 0111 | 6/128 | 5/128 | 26/128 | 27/128 | ... |
| 00110 | 0101 | 6/128 | 7/128 | 26/128 | 25/128 | ... |
| 00111 | 0100 | 8/128 | 7/128 | 24/128 | 25/128 | ... |
| 01000 | 1100 | 8/128 | 9/128 | 24/128 | 23/128 | ... |
| 01001 | 1101 | 10/128 | 9/128 | 22/128 | 23/128 | ... |
| 01010 | 1111 | 10/128 | 11/128 | 22/128 | 21/128 | ... |
| 01011 | 1110 | 12/128 | 11/128 | 20/128 | 21/128 | ... |
| 01100 | 1010 | 12/128 | 13/128 | 20/128 | 19/128 | ... |
| 01101 | 1011 | 14/128 | 13/128 | 18/128 | 19/128 | ... |
| 01110 | 1001 | 14/128 | 15/128 | 18/128 | 17/128 | ... |

TABLE 2-continued

| DATA<7:3> | GRAY<3:0> | SDAC1<0> | SDAC0<0> | SDAC1<1> | SDAC0<1> | ... |
|---|---|---|---|---|---|---|
| 01111 | 1000 | 16/128 | 15/128 | 16/128 | 17/128 | ... |
| 10000 | 1000 | 16/128 | 15/128 | 16/128 | 17/128 | ... |
| 10001 | 1001 | 14/128 | 15/128 | 18/128 | 17/128 | ... |
| 10010 | 1011 | 14/128 | 13/128 | 18/128 | 19/128 | ... |
| 10011 | 1010 | 12/128 | 13/128 | 20/128 | 19/128 | ... |
| 10100 | 1110 | 12/128 | 11/128 | 20/128 | 21/128 | ... |
| 10101 | 1111 | 10/128 | 11/128 | 22/128 | 21/128 | ... |
| 10110 | 1101 | 10/128 | 9/128 | 22/128 | 23/128 | ... |
| 10111 | 1100 | 8/128 | 9/128 | 24/128 | 23/128 | ... |
| 11000 | 0100 | 8/128 | 7/128 | 24/128 | 25/128 | ... |
| 11001 | 0101 | 6/128 | 7/128 | 26/128 | 25/128 | ... |
| 11010 | 0111 | 6/128 | 5/128 | 26/128 | 27/128 | ... |
| 11011 | 0110 | 4/128 | 5/128 | 28/128 | 27/128 | ... |
| 11100 | 0010 | 4/128 | 3/128 | 28/128 | 29/128 | ... |
| 11101 | 0011 | 2/128 | 3/128 | 30/128 | 29/128 | ... |
| 11110 | 0001 | 2/128 | 1/128 | 30/128 | 31/128 | ... |
| 11111 | 0000 | 0 | 1/128 | 32/128 | 31/128 | ... |

Sub-DAC voltages, SDAC0<0:7> and SDAC1<0:7>, output by the string of resistors 202 are shared by a first 16:1 multiplexer 230 and a second 16:1 multiplexer 250. Accordingly, the first sub-DAC voltage lines SDAC0 and second sub-DAC voltage lines SDAC1 of ROW0 through ROW7 are connected to the voltage input nodes, N<0:15>, of the first multiplexer 230 and the second multiplexer 250 such that the sub-DAC voltages SDAC0<0:7> and SDAC1<0:7> are provided as the 16 input voltages to each multiplexer. As illustrated in FIG. 2, the sub-DAC voltages SDAC0<0:7> and SDAC1<0:7> are connected to the input voltage nodes N<0:15> of the first multiplexer 230 in a first order, and are connected to the input voltage nodes N<0:15> of the second multiplexer 250 in a second order, wherein in the second order, the sub-DAC voltages SDAC0 and SDAC1 from each row are swapped. For example, for the first multiplexer 230, SDAC0<0> connects to N<0> and SDAC1<0> connects to N<1>, but for the second multiplexer 250, SDAC0<0> connects to N<1> and SDAC1<0> connects to N<0>.

Figure 4:
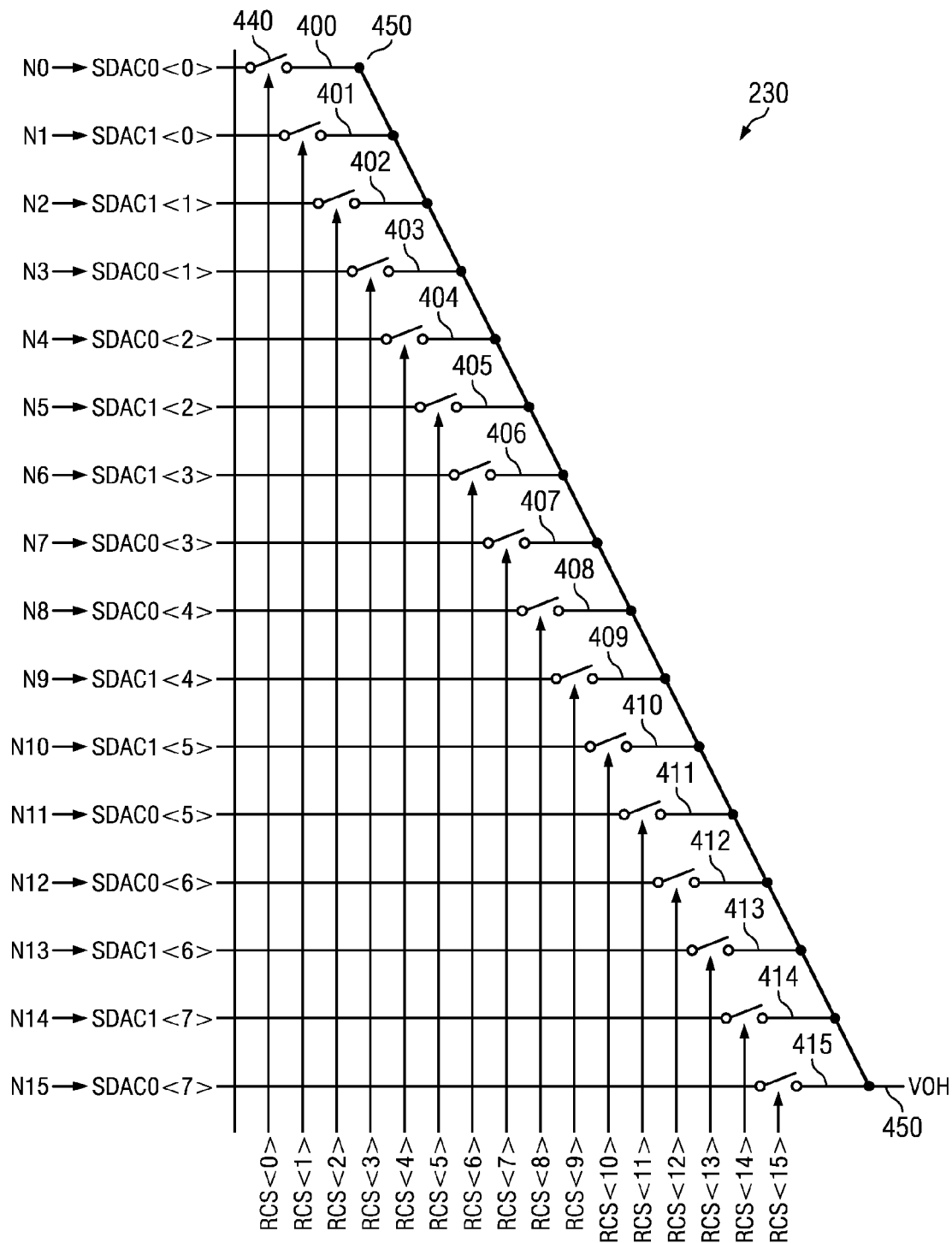
FIG. 4 is a circuit diagram for a first multiplexer having a first voltage output.

Reference is now made to FIG. 4, which illustrates the first multiplexer 230. The first multiplexer 230 includes 16 multiplexer voltage lines 400-415 and 16 input voltage nodes N<0:15>, wherein said multiplexer voltage lines 400-415 connect to input voltage nodes N<0:15>, respectively. Accordingly, each multiplexer voltage line receives an input voltage, wherein the input voltages connected to multiplexer voltage lines 400-415 are the respective sub-DAC voltages, SDAC0<0:7> and SDAC1<0:7>, connected to input voltage nodes N<0:15>, as illustrated in FIG. 2 and FIG. 4. For example, multiplexer voltage line 400 is connected to N0 and receives SDAC0<0>.

The multiplexer 230 further includes 16 switches 440 and a voltage output node 450. Each switch 440 is connected to one of the multiplexer voltage lines 400-415, and is operable, when selected, to transmit the sub-DAC voltage received on its respective multiplexer voltage line to the voltage output node 450 of the multiplexer 230, wherein the transmitted voltage is output as the high output voltage VOH of the coarse DAC circuit 200. For example, when the switch 440 located on multiplexer voltage line 401 is closed, the sub-DAC voltage SDAC1<0>, received on N1, is transmitted to the voltage output node 450 of the multiplexer 230. In accordance with this example, the high output voltage VOH of the coarse DAC circuit 200 is the sub-DAC voltage SDAC1<0>.

Figure 5:
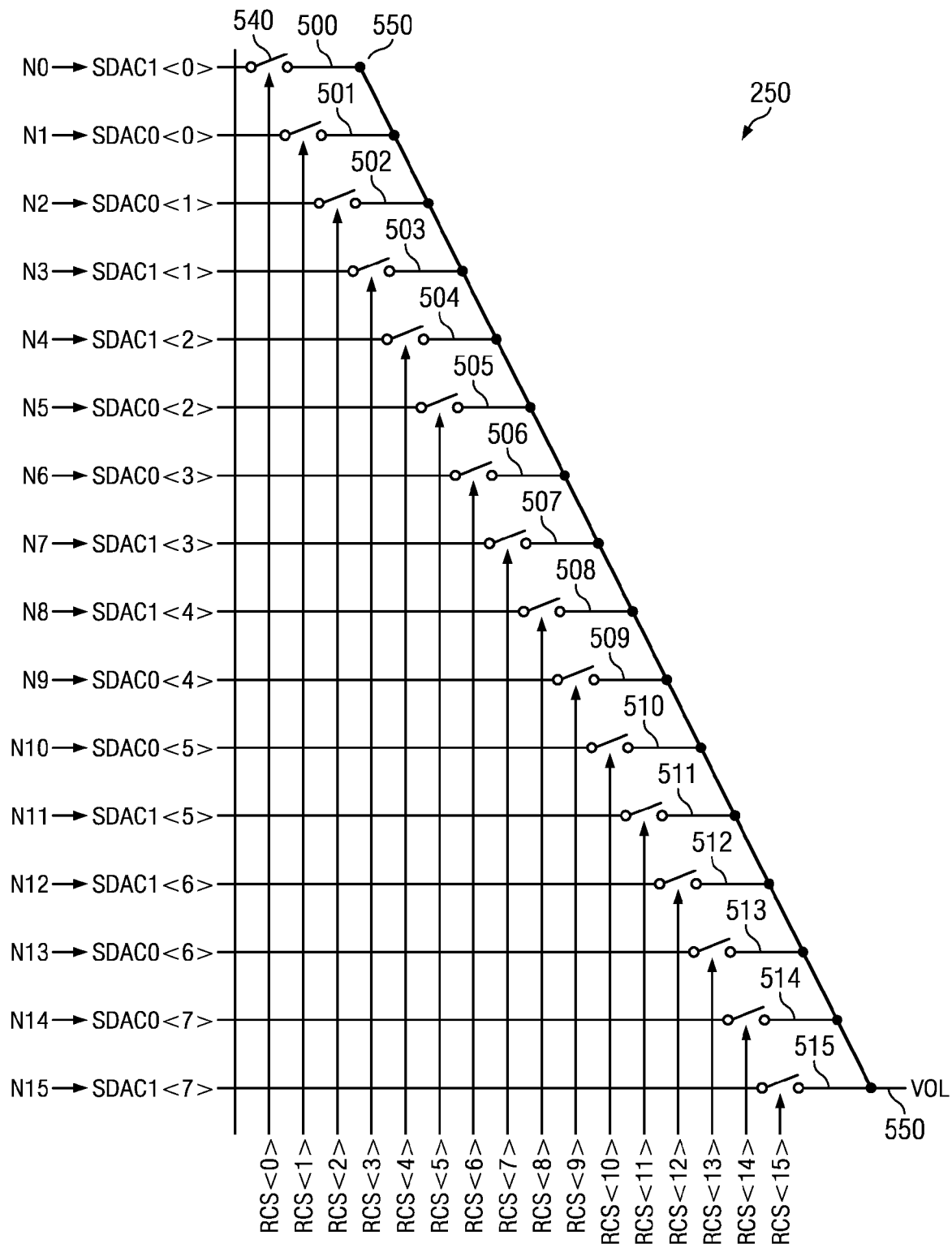
FIG. 5 is a circuit diagram for a second multiplexer having a second voltage output.

Reference is now made to FIG. 5, which illustrates the second multiplexer 250. The second multiplexer 250 includes 16 multiplexer voltage lines 500-515 and 16 input voltage nodes N<0:15>, wherein said multiplexer voltage lines 500-515 connect to input voltage nodes N<0:15>, respectively. Accordingly, each multiplexer voltage line receives an input voltage, wherein the input voltages connected to multiplexer voltage lines 500-515 are the respective sub-DAC voltages, SDAC0<0:7> and SDAC1<0:7>, connected to input voltage nodes N<0:15>, as illustrated in FIG. 2 and FIG. 5. For example, multiplexer voltage line 500 is connected to N0 and receives SDAC1<0>.

The multiplexer 250 further includes 16 switches 540 and a voltage output node 550. Each switch 540 is connected to one of the multiplexer voltage lines 500-515, and is operable, when selected, to transmit the sub-DAC voltage received on its respective multiplexer voltage line to the voltage output node 550 of the multiplexer 250, wherein the transmitted voltage is output as the low output voltage VOL of the coarse DAC circuit 200. For example, when the switch 540 located on multiplexer voltage line 501 is closed, the sub-DAC voltage SDAC0<0>, received on N1, is transmitted to the voltage output node 550 of the multiplexer 250. In accordance with this example, the low output voltage VOL of the coarse DAC circuit 200 is the sub-DAC voltage SDAC0<0>.

Referring now to FIG. 2, the three most significant bits (MSBs) of the input data, DATA<9:7>, and input data bit DATA<3> are input to a row decoder 220, and decoded to produce a set of unary row control signal bits RCS<0:15> (otherwise referred to as a row control signal), wherein said row decoder 220 may be any decoder circuit. The set of row control signal bits RCS<0:15> is the output of the row decoder 220, wherein each row control signal bit is connected to a switch 440 located in the first multiplexer 230 and to a switch 540 located in the second multiplexer 250. In essence, the set of row control signal bits RCS<0:15> selects the high and low output voltages, VOH and VOL, to be produced by said first multiplexer 230 and said second multiplexer 250, respectively. Accordingly, for a given row control signal RCS<0:15>, the high output voltage, VOH, for the first multiplexer 230 is a first voltage, while the low output voltage, VOL, for the second multiplexer 250 is a second voltage, wherein the difference between the two voltages is $2^N * V_{LSB}$, or the voltage across one resistor 202a in the string of resistors 202.

Referring back to the first multiplexer 230 illustrated in FIG. 4, respective row control signal bits RCS<0:15> are connected to the switches 440 affixed to respective multiplexer voltage lines 400-415. The switches 440 are activated by row control signal bits RCS<0:15> such that when the value of the row control signal bit connected to a switch 440 is a "1," the switch 440 is closed, and the voltage located at the switch 440 is transmitted to the voltage output node 450 of the multiplexer 230. The set of row control signal bits RCS<0:15> determines which one of the received sub-DAC voltages is selected as the high output voltage, VOH, of the first multiplexer 230. For example, if row control signal bit RCS<7> is a "1," the switch 440 connected to multiplexer voltage line 407 closes, and SDAC0<3> is transmitted to the voltage output node 450 of the multiplexer 230 and is the high output voltage, VOH, of the first multiplexer 230.

sub-DAC voltages SDAC1<5> and SDAC0<5> are the high and low voltages (VOH and VOL), respectively, wherein the difference between the high and low voltages is the voltage across the resistor 202a located between the activated switches 205 of Row 5. For example, if the switches 205 corresponding to CCS<11:12> are activated, then the difference between SDAC1<5> and SDAC0<5> is the voltage across resistor 84. Table 3 provides a list of the high and low output voltages, VOH and VOL, that correspond with a given set of row control signal bits RCS<0:15>, in accordance with the present disclosure.

TABLE 3

| DATA<9:7> | DATA<3> | RCS<0:15> | | | | | | | | | | | | | | | | VOH | VOL |
|---|---|---|---|---|---|---|---|---|---|---|---|---|---|---|---|---|---|---|---|
| 000 | 0 | 1 | 0 | 0 | 0 | 0 | 0 | 0 | 0 | 0 | 0 | 0 | 0 | 0 | 0 | 0 | 0 | SDAC1<0> | SDAC0<0> |
| 000 | 1 | 0 | 1 | 0 | 0 | 0 | 0 | 0 | 0 | 0 | 0 | 0 | 0 | 0 | 0 | 0 | 0 | SDAC0<0> | SDAC1<0> |
| 001 | 0 | 0 | 0 | 1 | 0 | 0 | 0 | 0 | 0 | 0 | 0 | 0 | 0 | 0 | 0 | 0 | 0 | SDAC1<1> | SDAC0<1> |
| 001 | 1 | 0 | 0 | 0 | 1 | 0 | 0 | 0 | 0 | 0 | 0 | 0 | 0 | 0 | 0 | 0 | 0 | SDAC0<1> | SDAC1<1> |
| 010 | 0 | 0 | 0 | 0 | 0 | 1 | 0 | 0 | 0 | 0 | 0 | 0 | 0 | 0 | 0 | 0 | 0 | SDAC1<2> | SDAC0<2> |
| 010 | 1 | 0 | 0 | 0 | 0 | 0 | 1 | 0 | 0 | 0 | 0 | 0 | 0 | 0 | 0 | 0 | 0 | SDAC0<2> | SDAC1<2> |
| 011 | 0 | 0 | 0 | 0 | 0 | 0 | 0 | 1 | 0 | 0 | 0 | 0 | 0 | 0 | 0 | 0 | 0 | SDAC1<3> | SDAC0<3> |
| 011 | 1 | 0 | 0 | 0 | 0 | 0 | 0 | 0 | 1 | 0 | 0 | 0 | 0 | 0 | 0 | 0 | 0 | SDAC0<3> | SDAC1<3> |
| 100 | 0 | 0 | 0 | 0 | 0 | 0 | 0 | 0 | 0 | 1 | 0 | 0 | 0 | 0 | 0 | 0 | 0 | SDAC1<4> | SDAC0<4> |
| 100 | 1 | 0 | 0 | 0 | 0 | 0 | 0 | 0 | 0 | 0 | 1 | 0 | 0 | 0 | 0 | 0 | 0 | SDAC0<4> | SDAC1<4> |
| 101 | 0 | 0 | 0 | 0 | 0 | 0 | 0 | 0 | 0 | 0 | 0 | 1 | 0 | 0 | 0 | 0 | 0 | SDAC1<5> | SDAC0<5> |
| 101 | 1 | 0 | 0 | 0 | 0 | 0 | 0 | 0 | 0 | 0 | 0 | 0 | 1 | 0 | 0 | 0 | 0 | SDAC0<5> | SDAC1<5> |
| 110 | 0 | 0 | 0 | 0 | 0 | 0 | 0 | 0 | 0 | 0 | 0 | 0 | 0 | 1 | 0 | 0 | 0 | SDAC1<6> | SDAC0<6> |
| 110 | 1 | 0 | 0 | 0 | 0 | 0 | 0 | 0 | 0 | 0 | 0 | 0 | 0 | 0 | 1 | 0 | 0 | SDAC0<6> | SDAC1<6> |
| 111 | 0 | 0 | 0 | 0 | 0 | 0 | 0 | 0 | 0 | 0 | 0 | 0 | 0 | 0 | 0 | 1 | 0 | SDAC1<7> | SDAC0<7> |
| 111 | 1 | 0 | 0 | 0 | 0 | 0 | 0 | 0 | 0 | 0 | 0 | 0 | 0 | 0 | 0 | 0 | 1 | SDAC0<7> | SDAC1<7> |

Referring back to the second multiplexer 250 illustrated in FIG. 5, respective row control signal bits RCS<0:15> are connected to the switches 540 affixed to respective multiplexer voltage lines 500-515. The switches 540 are activated by row control signal bits RCS<0:15> such that when the value of the row control signal bit connected to a switch 540 is a "1," the switch 540 is closed, and the voltage located at the switch 540 is transmitted to the voltage output node 550 of the multiplexer 250. The set of row control signal bits RCS<0:15> determines which one of the received sub-DAC voltages is selected as the low output voltage, VOL, of the second multiplexer 250. For example, if row control signal bit RCS<7> is a "1," the switch 540 connected to multiplexer voltage line 507 closes, and SDAC1<3> is transmitted to the voltage output node 550 of the multiplexer 250 and is the low output voltage, VOL, of the second multiplexer 250.

In accordance with the present embodiment, Table 3 illustrates the set of row control signal bits RCS<0:15> that is generated for given input data bits DATA<9:7> and DATA<3>. Table 3 also shows the respective VOH and VOL voltages corresponding to the generated row control signals RCS<0:15>. As described above with respect to FIGS. 2-5 and Table 3, the row decoder 220 generates a 16-bit row control signal comprising bits RCS<0:15>, wherein the row control signal RCS<0:15> is sent to the first multiplexer 230 and second multiplexer 250. For an example row control signal in which bit RCS<11> is set to a "1," SDAC0<5> is the high output voltage, VOH, of the first multiplexer 230, and SDAC1<5> is the low output voltage, VOL, of the second multiplexer 250. Accordingly, when RCS<11> is set, sub-DAC voltages SDAC0<5> and SDAC1<5> are the high and low voltages (VOH and VOL), respectively, wherein the difference between the high and low voltages is the voltage across the resistor 202a located between the activated switches 205 of Row 5. Conversely, when RCS<10> is set, The high and low output voltages (VOH and VOL) produced by the first and second multiplexers 230 and 250, respectively, are the coarse DAC circuit 200 outputs; wherein the high output voltage VOH is typically one tap 203 higher than the low output voltage VOL. In other words, the output voltages VOH and VOL stem from two adjacent resistor taps 203 (see FIG. 3 and Table 1), and the resistor tap 203 from which VOH is produced is located one tap higher (or rather, closer to the high reference voltage $VREF_{HIGH}$) along the string of resistors 202 than the resistor tap 203 from which VOL is produced.

As illustrated in FIG. 1, the two coarse DAC output voltages, VOH and VOL, are fed into a 3-bit voltage interpolation amplifier 150. The voltage interpolation amplifier 150 receives the three LSBs of the input data signal DATA<2:0> and the high and low output voltages VOH and VOL of the coarse DAC circuit 200, and produces the final output voltage $V_{OUT}$; wherein $V_{OUT}$ is the final output voltage of the 10-bit voltage interpolation DAC circuit 100.

The disclosed method and apparatus provides a distinct advantage over conventional systems by implementing Gray code in a differential resistor string DAC architecture for a high resolution coarse DAC with voltage interpolation such that the number of switches required by the circuit is significantly reduced, thereby reducing the required surface area and improving glitch performance without significantly increasing complexity of the circuit.

What is claimed is:

1. An apparatus comprising:
   a string of resistors disposed in an array of columns and rows between a first reference voltage node and a second reference voltage node, each resistor in the string having a resistor tap;
   a switch coupled to each resistor tap, wherein even switches in each row are operable to couple resistor taps in that row to one of a plurality of first voltage lines and odd switches in each row are operable to couple resistor taps in that row to one of a plurality of second voltage lines;

a converter operable to receive a first portion of input data and convert said first portion of input data to Gray code data; and a first decoder operable to receive said Gray code data and generate a first control signal, said first control signal operable to activate two adjacent columns of switches to output a voltage on the first and second voltage lines of each row.

2. The apparatus as set forth in claim 1, wherein the difference between the voltage output on the first voltage line of a row and the voltage output on the second voltage line of said row is equal to a voltage difference across one resistor disposed between the activated switches of said row.

3. The apparatus as set forth in claim 1, wherein resistor taps coupling two rows of resistors include a pair of switches coupled thereto, said pair of switches operable to couple the resistor tap coupling two rows of resistors to two of said plurality of second voltage lines.

4. The apparatus as set forth in claim 1, wherein said first decoder is a binary-to-unary decoder.

5. The apparatus as set forth in claim 1, further comprising a second decoder operable to receive a second portion of said input data and generate a second control signal.

6. The apparatus as set forth in claim 5, wherein said first and second portions of said input data share at least two bits.

7. The apparatus as set forth in claim 5, wherein said second decoder is a binary-to-unary decoder.

8. The apparatus as set forth in claim 5, further comprising a first multiplexer coupled to the plurality of first voltage lines and the plurality of second voltage lines, said first multiplexer operable in response to the second control signal to select one of the plurality of first voltage lines or one of the plurality of second voltage lines and output the voltage from the selected voltage line.

9. The apparatus as set forth in claim 8, further comprising a second multiplexer coupled to said plurality of first voltage lines and said plurality of second voltage lines, said second multiplexer operable in response to said second control signal to select one of said plurality of first voltage lines or one of said plurality of second voltage lines and output the voltage from the selected voltage line.

10. The apparatus as set forth in claim 9, wherein the voltage line selected by the second multiplexer is from the same row as the voltage line selected by said first multiplexer.

11. The apparatus as set forth in claim 9, wherein:
said plurality of first voltage lines and said plurality of second voltage lines are coupled to said first multiplexer in a sequential order beginning with one of said plurality of first voltage lines and alternating with said plurality of second voltage lines; and
said plurality of first voltage lines and said plurality of second voltage lines are coupled to said second multiplexer in a sequential order beginning with one of said plurality of second voltage lines and alternating with said plurality of first voltage lines.

12. The apparatus as set forth in claim 9, wherein said apparatus further comprises a voltage interpolation amplifier operable to receive a third portion of said input data, the voltage output from the first multiplexer, and the voltage output from the second multiplexer and produce a final output voltage.

13. The apparatus as set forth in claim 9, wherein the voltage output by the first multiplexer is greater than the voltage output by the second multiplexer.

14. The apparatus as set forth in claim 13, wherein the voltage output by the first multiplexer is one tap higher than the voltage output by the second multiplexer.

15. A digital-to-analog converter integrated circuit comprising:

a differential resistor string coarse digital-to-analog converter apparatus having a string of resistors disposed in an array of columns and rows between a first reference voltage node and a second reference voltage node, each resistor in the string having a resistor tap;

a switch coupled to each resistor tap, wherein even switches in each row are operable to couple resistor taps in that row to one of a plurality of first voltage lines and odd switches in each row are operable to couple resistor taps in that row to one of a plurality of second voltage lines;

a converter operable to receive a first portion of input data and convert said first portion of input data to Gray code data;

a first decoder operable to receive said Gray code data and generate a first control signal, said first control signal operable to activate two adjacent columns of switches to output a voltage on the first and second voltage lines of each row;

a second decoder operable to receive a second portion of said input data and generate a second control signal; and a first multiplexer coupled to the plurality of first voltage lines and the plurality of second voltage lines, said first multiplexer operable in response to the second control signal to select one of the plurality of first voltage lines or one of the plurality of second voltage lines and output the voltage from the selected voltage line.

16. The integrated circuit as set forth in claim 15, wherein the difference between the voltage output on the first voltage line of a row and the voltage output on the second voltage line of said row is equal to a voltage difference across one resistor disposed between the activated switches of said row.

17. The integrated circuit as set forth in claim 15, wherein resistor taps coupling two rows of resistors include a pair of switches coupled thereto, said pair of switches operable to couple the resistor tap coupling two rows of resistors to more than one of the plurality of second voltage lines.

18. The integrated circuit as set forth in claim 15, wherein said first and second decoders are binary-to-unary decoders.

19. The integrated circuit as set forth in claim 15, wherein said first and second portions of said input data share at least two bits.

20. The integrated circuit as set forth in claim 15, said integrated circuit further comprising:
a second multiplexer coupled to said plurality of first voltage lines and said plurality of second voltage lines, said second multiplexer operable in response to said second control signal to select one of said plurality of first voltage lines or one of said plurality of second voltage lines and output the voltage from the selected voltage line.

21. The integrated circuit as set forth in claim 20, wherein the voltage line selected by the second multiplexer is from the same row as the voltage line selected by the first multiplexer.

22. The integrated circuit as set forth in claim 20, wherein said integrated circuit further comprises a voltage interpolation amplifier operable to receive a third portion of said input data, the voltage output from the first multiplexer, and the voltage output from the second multiplexer and produce a final output voltage.

23. The integrated circuit as set forth in claim 20, wherein:
said plurality of first voltage lines and said plurality of second voltage lines are coupled to said first multiplexer in a sequential order beginning with one of said plurality of first voltage lines and alternating with said plurality of second voltage lines; and said plurality of first voltage lines and said plurality of second voltage lines are coupled to said second multiplexer in a sequential order beginning with one of said plurality of second voltage lines and alternating with said plurality of first voltage lines.

24. The integrated circuit as set forth in claim 20, wherein the voltage output by the first multiplexer is greater than the voltage output by the second multiplexer.

25. The integrated circuit as set forth in claim 24, wherein the voltage output by the first multiplexer is one tap higher than the voltage output by the second multiplexer.

26. A method for implementing Gray code to control columns of switches coupled to resistor taps, said method comprising:
  applying a reference voltage across a string of series-connected resistors arranged in a column and row format;
  receiving a first portion of input data bits;
  converting said first portion of input data bits to Gray code bits;
  decoding said Gray code bits to generate a first control signal;
  using said first control signal to select two adjacent switches in each row;
  closing a first one of said selected switches in each row to transmit a first resistor string voltage in each row to one of a plurality of first voltage lines; and
  closing a second one of said selected switches in each row to transmit a second resistor string voltage in each row to one of a plurality of second voltage lines.

27. The method as set forth in claim 26, said method further comprising:
  receiving each of said first and said second resistor string voltages at a first multiplexer;
  receiving each of said first and said second resistor string voltages at a second multiplexer;
  receiving and decoding a second portion of said input data bits to generate a second control signal;
  using said second control signal to select one of the first or second resistor string voltages received at said first multiplexer;
  outputting the selected first or second resistor string voltage from said first multiplexer as a first output voltage;
  using said second control signal to select one of the first or second resistor string voltages received at said second multiplexer; and
  outputting the selected first or second resistor string voltage from said second multiplexer as a second output voltage.

28. The method as set forth in claim 26, wherein said first and second portions of input data bits share at least two bits.

29. The method as set forth in claim 26, said method further comprising:
  receiving a third portion of input data bits and said first and second output voltages from said first and second multiplexers at a voltage interpolation amplifier; and
  interpolating said first and second output voltages to produce a final output voltage from said voltage interpolation amplifier.

* * * * *